United States Patent
Messick et al.

(10) Patent No.: US 11,844,192 B2
(45) Date of Patent: Dec. 12, 2023

(54) CHASSIS LAYOUT MONITORING AND ANALYSIS TO ENHANCE TEMPERATURE MANAGEMENT

(71) Applicant: Dell Products L.P., Round Rock, TX (US)

(72) Inventors: Douglas E. Messick, Austin, TX (US); Muhammad Ahmed, Round Rock, TX (US); Richard Eiland, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 188 days.

(21) Appl. No.: 17/443,074

(22) Filed: Jul. 20, 2021

(65) Prior Publication Data

US 2023/0027111 A1  Jan. 26, 2023

(51) Int. Cl.
*H05K 7/20* (2006.01)
*G06F 1/20* (2006.01)
*G06F 1/18* (2006.01)

(52) U.S. Cl.
CPC ......... *H05K 7/20209* (2013.01); *G06F 1/181* (2013.01); *G06F 1/206* (2013.01); *H05K 7/20736* (2013.01)

(58) Field of Classification Search
CPC .......... G06F 1/181; G06F 1/206; G06F 1/183; G06F 1/187; G06F 1/20; H05K 7/20209; H05K 7/20736

USPC ........................................................ 700/300
See application file for complete search history.

(56) References Cited

U.S. PATENT DOCUMENTS

| | | | |
|---|---|---|---|
| 2008/0046766 A1* | 2/2008 | Chieu | H05K 7/20836 713/300 |
| 2008/0217962 A1* | 9/2008 | Boduch | H05K 7/1425 296/204 |
| 2015/0095270 A1* | 4/2015 | Shabbir | G06Q 10/00 706/12 |
| 2015/0192937 A1* | 7/2015 | Govindarajan | G05B 15/02 700/275 |
| 2017/0329651 A1* | 11/2017 | Ragupathi | G06F 9/5005 |
| 2020/0037464 A1* | 1/2020 | Shabbir | H05K 7/207 |
| 2020/0410059 A1* | 12/2020 | Barnette | G06F 30/17 |
| 2022/0350383 A1* | 11/2022 | Ahmed | G06N 3/08 |

* cited by examiner

*Primary Examiner* — Chun Cao
(74) *Attorney, Agent, or Firm* — Norton Rose Fulbright US LLP

(57) ABSTRACT

A number of slots in a chassis of an information handling system and a number of a plurality of sleds to be housed in the chassis may be determined. An airflow for each of the plurality of sleds in each of the plurality of placement configurations may be determined based, at least in part, on the number of slots in the chassis and the number of the plurality of sleds to be housed in the chassis. A recommended placement for each of the sleds may be determined based at least in part on the airflow for each of the plurality of sleds for the plurality of placement configurations. A notification may be generated comprising the recommended placements for each of the plurality of sleds.

17 Claims, 7 Drawing Sheets

CHASSIS LAYOUT MONITORING AND ANALYSIS TO ENHANCE TEMPERATURE MANAGEMENT

FIELD OF THE DISCLOSURE

The present disclosure generally relates to information handling systems, and more particularly relates to chassis sled layout determination in information handling systems.

BACKGROUND

As the value and use of information increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

Some information handling systems may include a chassis that has one or more slots for housing sleds. For example, an information handling system chassis may have a plurality of slots for housing sleds that serve a variety of functions. Sled functionality may include data processing, networking, data storage, and other functions. For example, some sleds may include multiple hard disks or solid state drives for information storage, while other sleds may include multiple processors for processing of information. Sleds that are housed in chassis may consume different amounts of power, generate different amounts of heat, and may require different amounts of cooling to remain within desired operational parameters depending on functionality of and components included in the sleds. For example, some sleds may have a higher relative impedance than others, allowing less air to flow through and thus requiring more cooling to maintain the sleds at a desired operating temperature. Some sleds may generate more heat during operation than others, requiring more cooling to dissipate the generated heat. Some sleds may have lower required or recommended operating temperatures than others, requiring additional cooling to maintain the sleds at required operating temperatures. Thus, some sleds housed in a chassis of an information handling system may require more cooling than other sleds to remain within predetermined operating parameters.

Shortcomings mentioned here are only representative and are included simply to highlight that a need exists for improved information handling systems. Embodiments described herein address certain shortcomings but not necessarily each and every one described here or known in the art. Furthermore, embodiments described herein may present other benefits than, and be used in other applications than, those of the shortcomings described above.

SUMMARY

An information handling system may analyze a plurality of sleds to be housed in a chassis to determine a placement configuration of the plurality of sleds within the chassis that will minimize an amount of cooling needed to cool each of the sleds. For example, an information handling system may determine airflow for each sled in all possible sled placement configurations within the chassis based on the number of sleds to be housed in a chassis, the number of slots in the chassis, and the properties of the sleds to be housed in the chassis. For example, if there are eight slots in a chassis and eight different sleds to be housed in the chassis, the information handling system may determine an airflow for each sled for each of the 40,320 possible placement configurations of the sleds. Based on the determined airflow for each of the sleds in each of the placement configurations, the information handling system may determine a recommended layout for the sleds within the chassis. For example, the information handling system may determine an amount of cooling required by each of the sleds, such as a slot fan pulse width modulation percentage (% PWM) based on the determined airflow and may determine a recommended placement configuration for the sleds within the chassis that minimizes an amount of cooling required. The information handling system may also monitor placement of the sleds within the chassis to detect when sleds are not configured according to a recommended placement configuration and may generate a notification, such as an alert for an administrator of the information handling system, comprising recommended placement improvements. Determination of placements of sleds within a chassis based on determined airflow may reduce an amount of power required to cool a chassis, reducing energy usage and expenditure. Such placement determination may also allow for chassis-sled combinations to be sold and used that would not be available otherwise, such as in situations when a worst-case scenario sled placement is assumed, by providing recommendations for sled placement based on determined airflow. Furthermore, generating alerts of improvements that can be made in sled placement may inform administrators of potential improvements in energy usage and expenditure through chassis layout adjustments, enhancing user satisfaction.

An information handling system may perform a method for determining positioning for a plurality of sleds within a chassis of an information handling system. For example, an information handling system including the chassis and sleds itself may perform such a method, or another information, such as a remote cloud-based information handling system, may perform such a method. A number of slots in a chassis of an information handling system may be determined. In some embodiments, all chassis may be assumed to have a constant number of slots, such as eight, while in other embodiments, an information handling system may query a chassis or a data storage unit storing data about one or more chassis to determine a number of slots of the chassis.

A number of sleds to be housed in the chassis may also be determined. For example, an information handling system having eight slots may house anywhere from one to eight sleds within the eight slots. A number of sleds may be determined by receiving an input, such as an input from a user or a remote information handling system, specifying a number of sleds to be housed in the chassis. Alternatively, a number of sleds to be housed in the chassis may be determined by sensing the sleds in the chassis. In some embodiments, identities of the sleds to be housed in the chassis, such as sled service tags of the sleds to be housed in the chassis, may be determined, such as a model of each of the sled, a functionality of each of the sleds, an airflow threshold, such as a required airflow, of each of the sleds, and/or a relative impedance of each of the sleds.

An airflow for each of the sleds in each of a plurality of sled placement configurations may be determined based, at least in part, on the number of sleds and the number of slots in the chassis. For example, the information handling system may determine based on the number of sleds and the number of slots within the chassis all possible sled placement configurations. For example, if a chassis with eight slots is to house eight different sleds, the chassis and sleds may have 40,320 possible different placement configurations. Different airflow may be obtained by each sled depending on the sled's positioning within the chassis and based on the positioning of other sleds within the chassis. For example, a sled that is surrounded by other sleds having high relative impedances may be less than an airflow for a sled placed with empty slots on either side, or near an edge of the chassis. Thus, an airflow for each sled for each of a plurality of potential sled placement configurations, such as all possible sled placement configurations, may be determined. In some embodiments, an airflow for each slot of the information handling system may be determined, including an airflow for slots that do not house a sled. In some embodiments, the determined airflow may be a determined airflow to be provided by a cooling system of the chassis or an ambient airflow through the chassis.

A recommended placement for each of the plurality of sleds within the chassis may be determined based, at least in part, on the determined airflow for each of the sleds in each of the plurality of configurations. For example, the information handling system may recommend a placement of the sleds that will minimize an amount of cooling needed to maintain the sleds within predetermined operational parameters, such as within predetermined temperature thresholds. The information handling system may, for example, select one of the plurality of placement configurations, such as one of the possible placement configurations for recommendation and may determine a placement for each of the sleds based on the selected placement configuration. In some embodiments, other information may be determined based on the recommended placement for each of the plurality of sleds such as an amount of energy and/or money saved by placing the sleds in the recommended placements due to a reduction in cooling required to maintain the sleds within the predetermined temperature thresholds.

Determining the recommended placement for each of the plurality of sleds may include determining one or more first recommended placement configurations from the plurality of placement configurations that have a lowest highest fan control parameter, such as a slot fan pulse with modulation percentage (% PWM), of the plurality of sleds. For example, a slot fan control parameter, such as a slot fan % PWM, for each of the plurality of sleds for each of a plurality of placement configurations may be determined by dividing an airflow threshold, such as a required airflow, for the sled by a multiple of the determined airflow for the sled, such as by 100 times the determined airflow for the sled. In some embodiments, an information handling. System may determine an airflow threshold for each of the sleds. For example, an airflow threshold for each of the sleds may be a required airflow for each of the sleds and may be determined based on a model of each of the sleds. For example, certain predetermined airflow threshold may be established for each of a variety of sled models. An information handling system may then analyze each of the plurality of placement configurations to determine a greatest slot fan control parameter, such as a greatest slot fan % PWM, across all of the slots in each placement configuration. The information handling system may compare the greatest slot fan control parameters, such as slot fan % PWMs, of each placement configuration, discarding placement configurations with a greatest slot fan control parameter, such as a slot fan % PWM, higher than a greatest slot fan control parameter, such as a slot fan % PWM, of any other placement configuration. Thus, the information handling system may select placement configurations having a lowest highest slot fan control parameter, such as a lowest highest slot fan % PWM. In some embodiments, the information handling system may discard placement configurations with a greatest slot fan control parameter, such as a slot fan % PWM, more than a certain percentage higher than a greatest slot fan control parameter, such as a slot fan % PWM, of the placement configuration having the lowest highest slot fan control parameter, such as a slot fan % PWM. The recommended placements for each of the plurality of sleds may be determined based upon the determination of the one or more first recommended placement configurations. For example, if only one placement configuration has a lowest highest % PWM, the recommended placements for each of the plurality of sleds may be determined based, at least in part, on the placement configuration having the lowest highest % PWM.

In some embodiments, after determining a plurality of placement configurations having a lowest highest slot fan control parameter, such as a slot fan % PWM, the information handling system may then determine one or more second recommended placement configurations from among the first recommended placement configurations, the second recommended placement configurations having a lowest second-highest slot fan control parameter, such as a slot fan % PWM, of the one or more first recommended placement configurations. For example, an information handling system may discard a sled having a highest slot fan control parameter, such as a slot fan % PWM, from each remaining placement configuration. The information handling system may then, from the remaining placement configurations, select one or more placement configurations having a lowest highest remaining slot fan control parameter, such as a slot fan % PWM. The information handling system may repeat this process, analyzing slots of remaining placement configurations to determine placement configurations that have a lowest highest remaining slot fan control parameter, such as a slot fan % PWM, and dropping slots of the remaining placement configurations that have a highest slot fan control parameter, such as a slot fan % PWM, until only a single placement configuration remains or all slots of the remaining placement configurations have been cycled through.

In some embodiments, a determination may be made, for each placement configuration, of the one or more of the plurality of placement configurations, that the determined airflow for each of the plurality of sleds is greater than or equal to an airflow threshold for each of the plurality of sleds. For example, an information handling system may determine all possible placement configurations given a number of sleds and a number of slots in a chassis. The information handling system may compare a determined airflow for each sled in each configuration with an airflow threshold for each sled in each placement configuration. Placement configurations where a determined airflow of any sled is less than an airflow threshold of the sled may be discarded from consideration. Then % PWM analysis may be performed on the remaining configurations. Thus, for each placement configuration on which % PWM analysis is performed, an airflow threshold of each sled may be less than or equivalent to a determined airflow of the sled.

In some embodiments, a current placement of each of the plurality of sleds within the chassis may be determined. An information handling system may communicate with or otherwise sense the one or more sleds within the chassis to determine the slots that the sleds occupy. For example, the information handling system may determine specific sleds, such as specific sled models, that are located in specific slots of the chassis. The current placement of the sleds within the chassis may be compared with the recommended placement of each of the sleds within the chassis to determine if the current placement of the sleds matches the recommended placement of the sleds. If one or more of the current sled placements do not match the recommended sled placements, an alert may be generated to allow a user, such as an administrator, to take corrective action.

A notification may be generated comprising the recommended placement of sleds. For example, a layout of the recommended sleds may be displayed on a display of an information handling system. Generation of a notification comprising the recommended placement of sleds may also include generating an alert of a mismatch between the current placements of the sleds and a recommended placement of the sleds. For example, an alert may be displayed on a display of an information handling system alerting a user such as an administrator of the information handling system of the placement mismatch. Alternatively or additionally, an alert may be emitted by a chassis or one or more of the sleds of the chassis, such as an audio alert, or activation of one or more light emitting diodes (LEDs) on the chassis and/or one or more of the sleds. Such notification may inform a user of placement options that the user may not have otherwise been aware of, enabling cost and energy savings.

In some embodiments, an information handling system may include a memory and a processor for performing the methods described herein. A computer program product may include a non-transitory computer-readable medium including instructions for causing an information handling system to perform the method described herein.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be used in this application. The teachings can also be used in other applications and with several different types of architectures.

For purposes of this disclosure, an information handling system (IHS) may include any instrumentality or aggregate of instrumentalities operable to compute, determine, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, a two-in-one laptop/tablet computer, mobile device (e.g., personal digital assistant (PDA), smart phone, tablet computer, or smart watch), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more virtual or physical buses operable to transmit communications between the various hardware and/or software components.

Figure 1:
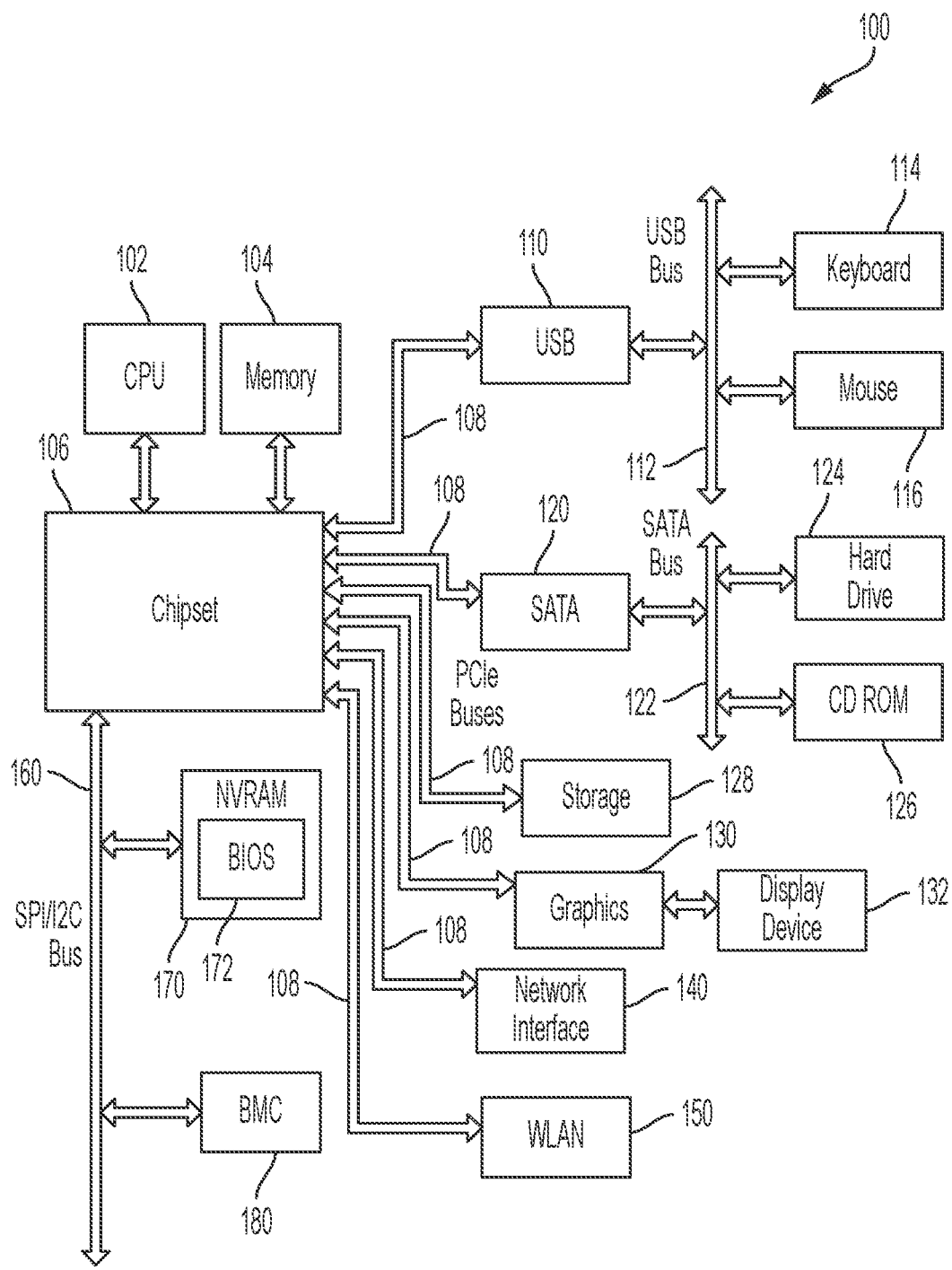
FIG. 1 is a block diagram of an example information handling system according to some embodiments of the disclosure.

FIG. 1 illustrates an example information handling system 100. Information handling system 100 may include a processor 102, a memory 104, a chipset 106, one or more PCIe buses 108, a universal serial bus (USB) controller 110, a USB bus 112, a keyboard device controller 114, a mouse device controller 116, a configuration a SATA bus controller 120, a SATA bus 122, a hard drive device controller 124, a compact disk read only memory (CD ROM) device controller 126, a storage 128, a graphics device controller 130, a network interface controller (NIC) 140, a wireless local area network (WLAN) or wireless wide area network (WWAN) controller 150, a serial peripheral interface (SPI) bus 160, a NVRAM 170 for storing BIOS 172, and a baseboard management controller (BMC) 180. In one example embodiment, chipset 106 may be directly connected to an individual end point via a PCIe root port within the chipset and a point-to-point topology as shown in FIG. 1. BMC 180 may be referred to as a service processor or embedded controller (EC). Capabilities and functions provided by BMC 180 may vary considerably based on the type of information handling system. For example, the term baseboard management system may be used to describe an embedded processor included at a server, while an embedded controller may be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system may be referred to as a storage enclosure processor or a chassis processor.

System 100 may include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 may be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally may provide an abstraction layer for the hardware, such as a consistent way for application programs and operating systems to interact with the keyboard, display, and other input/output devices. When power is first applied to information handling system 100, the system may begin a sequence of initialization procedures. During the initialization sequence, also referred to as a boot sequence, components of system 100 are configured and enabled for operation, and device drivers may be installed. Device drivers may provide an interface through which other components of the system 100 can communicate with a corresponding device.

Information handling system 100 may include additional components and additional busses, not shown for clarity. For example, system 100 may include multiple processor cores, audio devices, and the like. While a particular arrangement of bus technologies and interconnections is illustrated for the purpose of example, one of skill will appreciate that the techniques disclosed herein are applicable to other system architectures. System 100 may include multiple CPUs and redundant bus controllers. One or more components may be integrated together. For example, portions of chipset 106 can be integrated within CPU 102. Additional components of information handling system 100 may include one or more storage devices that may store machine-executable code, one or more communications ports for communicating with external devices, and various input and output (I/O) devices, such as a keyboard, a mouse, and a video display. An example of information handling system 100 includes a multi-slot chassis system where groups sleds share a common chassis. Each of the sleds may have a unique set of resources assigned. Sleds may, for example, include blade servers of the chassis, input/output (I/O) modules, Peripheral Component Interconnect-Express (PCIe) cards, storage controllers, and the like.

Figure 2A:
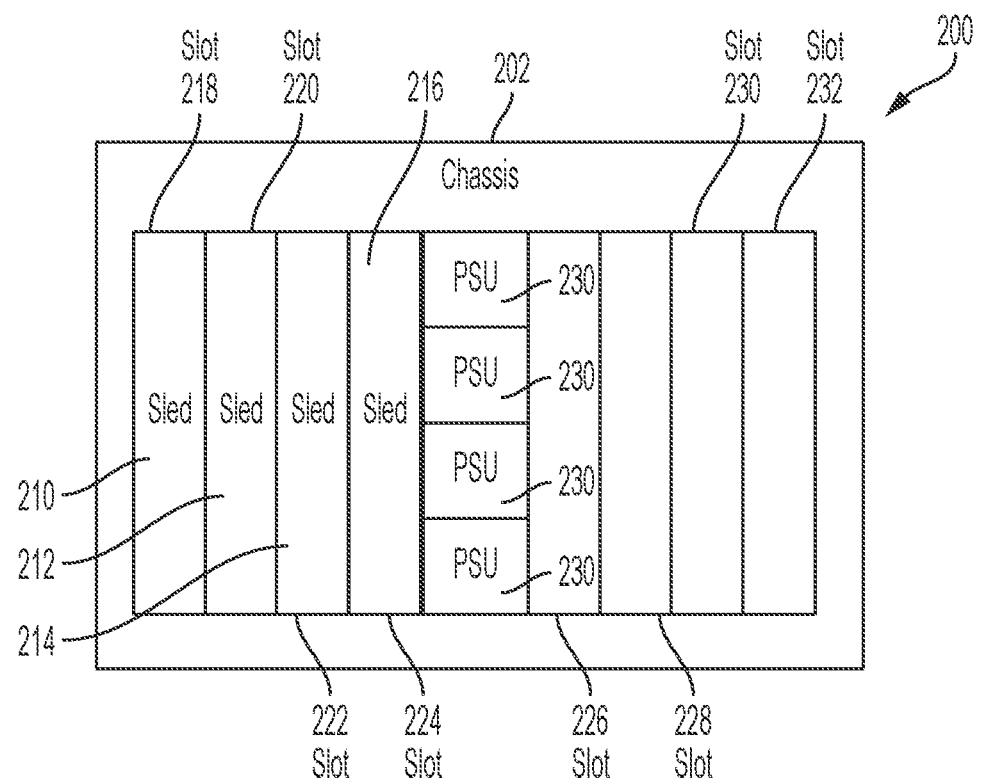
FIG. 2A is an illustration of an example information handling system including a chassis housing a plurality of sleds in a first configuration according to some embodiments of the disclosure.

Sleds 210, 212, 214, and 216 of FIG. 2A may, for example, each be information handling systems. Alternatively or additionally, the overall system 200 of FIG. 2 including the chassis 202, the sleds 210, 212, 214, and 216, the PSUs 230, and the chassis 202 may be an information handling system. Thus, in some embodiments, information handling systems may themselves comprise multiple information handling systems. Information handling system 100 may include a set of instructions that can be executed to cause the information handling system to perform any one or more of the methods or computer-based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 may be implemented using electronic devices that provide voice, video, or data communication. Further, while a single information handling system 100 is illustrated, the term "system" shall also be taken to include any collection of systems or subsystems that individually or jointly execute a set, or multiple sets, of instructions to perform one or more computer functions.

An information handling system 100 may include a chassis 202 having a plurality of slots 218, 220, 222, 224, 226, 228, 230, 232 for housing one or more sleds 210, 212,

214, 216. In some embodiments, one or more of the slots 218, 220, 222, 224, 226, 228, 230, 232 of the chassis 202 may remain empty, while in other embodiments, all of the slots 218, 220, 222, 224, 226, 228, 230, 232 may house sleds. For example, the chassis 202 having eight slots 218, 220, 222, 224, 226, 228, 230, 232 may house anywhere from one to eight sleds. In some embodiments, chassis may include greater than or fewer than eight slots. In the example of FIG. 2A, the chassis 202 houses four sleds 210, 212, 214, and 216 situated adjacent to each other. Thus, as shown in FIG. 2A, slots 218-224 may house sleds 210-216, while slots 226-232 may remain empty. PSUs 230 may provide power to each of sleds 210-216. Different sleds may have different properties. For example, some sleds may be processing sleds for processing information, such as blade servers, while other sleds may include functionality for receiving and transmitting information, such as input/output (I/O) modules. As another example, some sleds may include ports for connecting to other devices and/or information handling systems, such as Peripheral Component Interconnect-Express (PCIe) cards, while other sleds may include functionality for storing information, such as storage controllers, data storage sleds including one or more hard drives or solid state drives, and the like. Thus, a variety of sled configurations may be available. In some embodiments, a recommended placement configuration may be determined based on an airflow determined for each of the slots of the chassis, including slots not housing sleds.

Different sleds, with different functionality, may have different heat generation characteristics and requirements. For example, sleds for data processing may generate more heat than PCIe sleds. Different sleds may also allow for different amounts of airflow across and/or through the sleds. For example, some sleds may be more densely constructed and may have an airflow resistance greater than that of other sleds. For example, if sled 210 is a data processing sled, such as a blade server, sled 210 may have a greater airflow resistance than sled 212, if sled 212 is a PCIe sled. Different sleds may have different airflow requirements necessary to maintain the different sleds at a predetermined temperature level, such as below a predetermined temperature threshold. For example, a data processing sled may require more cooling than a data storage sled to maintain the data processing sled within desired temperature parameters. Cooling across sleds 210-216 may vary based on a location at which the sleds 210-216 are placed within the chassis and based on the position of the sleds 210-216 relative to each other. For example, if sled 212 is placed between two sleds with low airflow resistances, sled 212 may receive less airflow than if sled 212 were placed in slot 218 at an edge of the chassis 202. Thus, determined airflow provided to each of the sleds, such as a maximum airflow generated for each sled by internal and/or external cooling, may vary based on a placement configuration of the sleds within the chassis 202. The maximum cooling capacity and/or fan power for the chassis may occur when a sled having a highest required cooling, or required airflow, is stressed and/or experiences high temperatures. For example, an airflow threshold for each sled 210-216 may be set at a required airflow for each sled when the sled is operating at maximum capacity and/or generating a maximum amount of heat. Placement of the sleds 210-216 adjacent to one another, as shown in FIG. 2A, may not maximize airflow provided to the sleds and minimize an amount of power expended on cooling the sleds in the chassis, such as by running chassis fans and/or fans internal to the sleds 210-216. A recommended placement for each of the sleds 210-216 within the chassis 202 may be determined based on a determined airflow for each of the sleds in multiple configurations. For example, in a chassis having eight slots and eight different sleds, 40,230 different placement configurations may be possible. An information handling system may determine a placement for each of the sleds within the chassis that minimizes an amount of cooling required to cool the sleds within the chassis. The number of placement configurations analyzed may vary based on a number of slots within a chassis and a number of different sleds to be housed within the slots of a chassis.

Figure 2B:
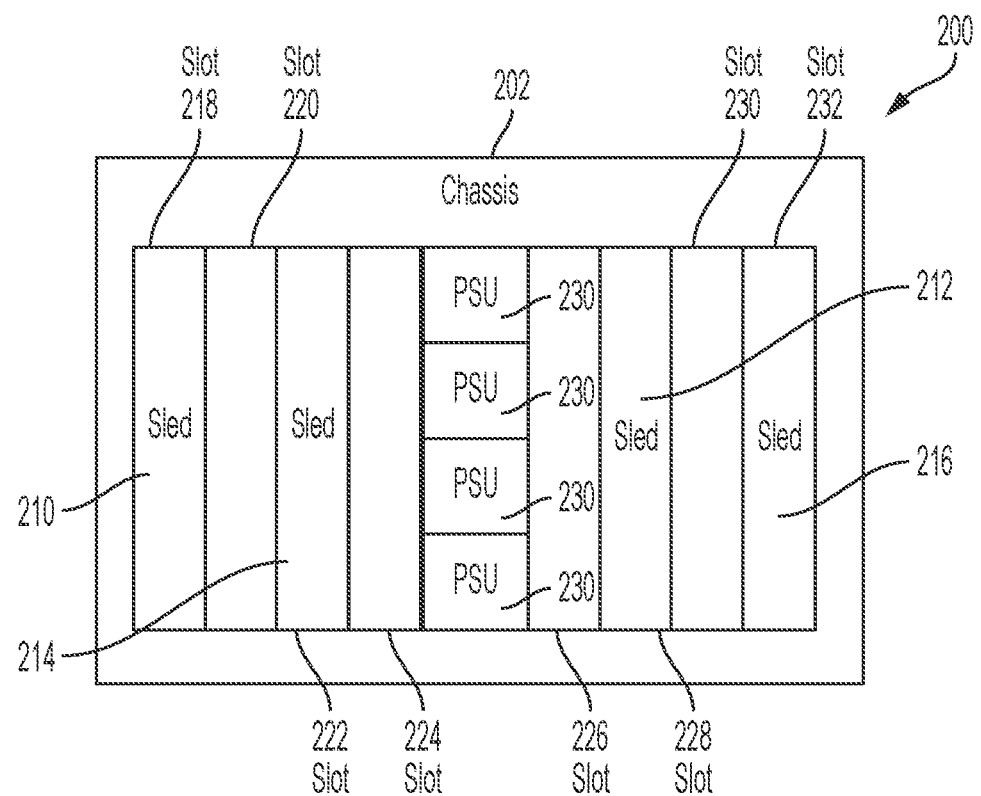
FIG. 2B is an illustration of an example information handling system including a chassis housing a plurality of sleds in a second configuration according to some embodiments of the disclosure.

For example, an information handling system, such as the information handling system 200, or an external information handling system, may determine that a placement configuration similar to the placement configuration shown in FIG. 2B, or another placement configuration, should be recommended based on determined airflows for each of the slots in multiple possible placement configurations for the sleds 210-216. An example placement configuration of sleds 210-216 within the slots 218-232 of chassis 202 of the information handling system 200 that may provide enhanced airflow over the configuration of FIG. 2A is shown in FIG. 2B. As shown in FIG. 2B, the sleds 210-216 are staggered within the chassis 202, with sled 210 housed in slot 218, sled 214 in slot 222, sled 212 in slot 228, and sled 216, in slot 232. The slots 220, 224, 226, and 228 may remain empty. Staggering sleds such that empty slots are spaced between the sleds may reduce an amount of cooling required to provide required cooling to each of the sleds 210-216. Placement of the sleds as shown in FIG. 2B, staggered with blanks in the adjacent slots, may provide enhanced airflow to the sleds, as the blanks may have a high air flow resistance forcing the air from a cooling system of the chassis 202 to travel across the sleds instead. For example, the placement configuration of FIG. 2A may require 303 Watts (W) of cooling capacity, such as 303 W of rear fan power, to provide required airflow to each of the sleds, while the placement configuration of FIG. 2B may require only 229 W of cooling capacity, such as 229 W of rear fan power, to provide a required airflow to each of the sleds. Alternatively, another configuration of sleds 210-216 within the slots 218-232 of the chassis 202 may be determined based on the airflow to each of the sleds 210-216.

An airflow for each of the sleds in a plurality of placement configurations, such as each possible placement configuration of sleds within the slots of a chassis, may be determined using a machine learning algorithm or other methods, such as methods described in U.S. patent application Ser. No. 17/242,443 to Ahmed et al. and entitled "SLOT AIRFLOW BASED ON A CONFIGURATION OF THE CHASSIS," which is hereby incorporated by reference. For example, an airflow for each of the sleds in each of the plurality of placement configurations may be determined using one or more linear regression equations.

Figure 3:
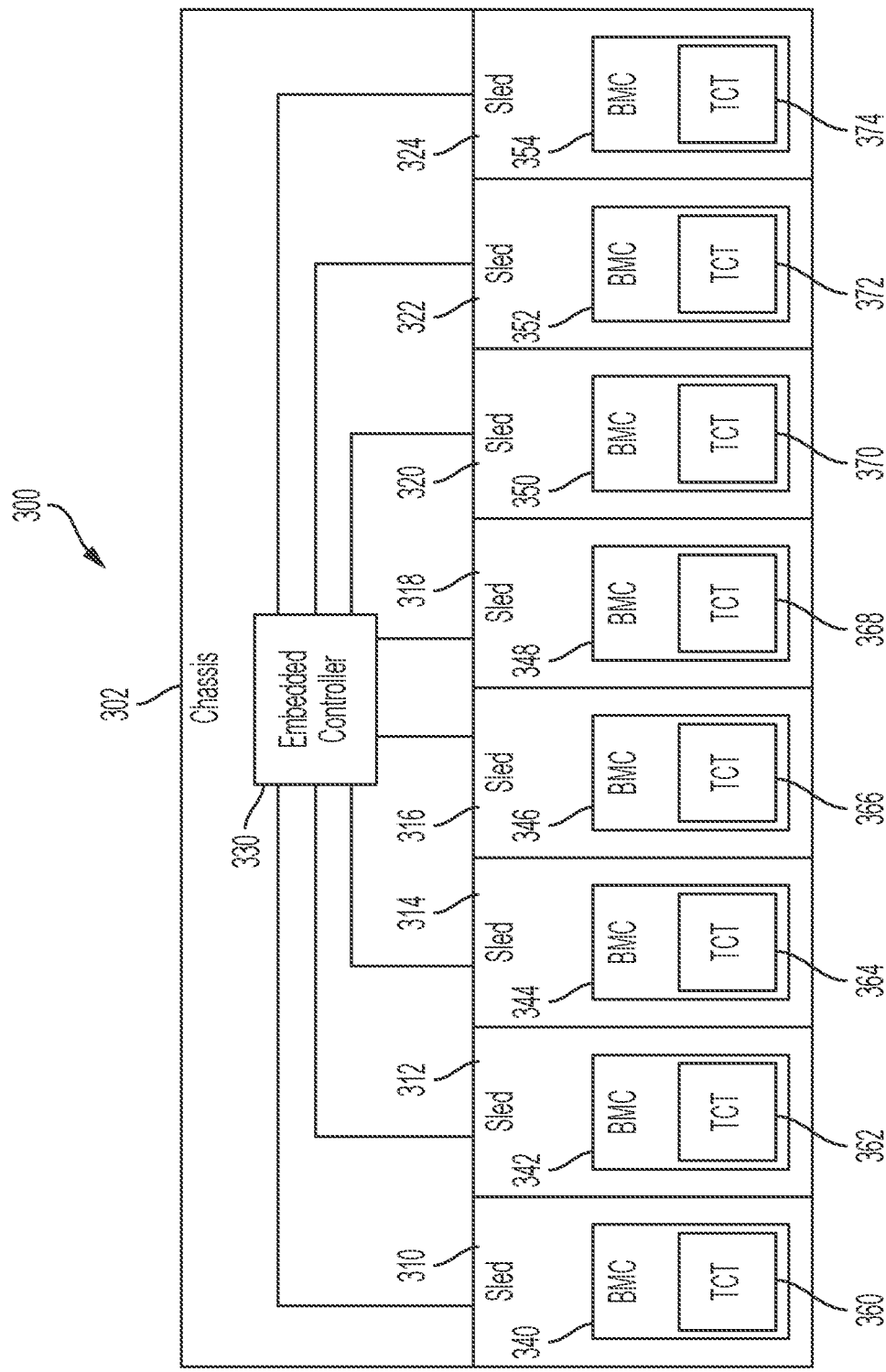
FIG. 3 is an illustration of an example information handling system including a chassis, an embedded controller, and a plurality of sleds according to some embodiments of the disclosure.

FIG. 3 illustrates a portion of an information handling system 300 including a chassis 302, multiple sleds 310, 312, 314, 316, 318, 320, 322, and 324 (sleds 310-324), and an embedded controller 330 according to at least one embodiment of the disclosure. In some embodiments, the embedded controller 330 may perform all or part of the methods described herein. Each sled 310-324 may communicate with embedded controller 300. Each of sleds 310-324 may include a respective baseboard management controller (BMC) 340, 342, 344, 346, 348, 350, 352, and 354 (BMCs 340-352), and respective thermal control tables (TCT) 360, 362, 364, 366, 368, 370, 372, and 374. In some embodiments, sleds 310 may include any additional hardware devices including, but not limited to, a CPU, one or more dual inline memory modules (DIMMs), network interface cards (NICs), hard disk drives (HDDs), and solid-state drives (SSDs). In some embodiments, a BMC may be a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. In some embodiments, each BMC 340-354 may store any suitable data within a respective memory of the BMC including, but not limited to, respective TCT 360-374. In some embodiments, information handling system 300 may include additional components over those shown in FIG. 3 without varying from the scope of this disclosure.

In some cases, an individual may purchase a sled, such as sled 310, with specific components. For example, the components of sled 310 may include, but is not limited to, CPUs with certain power capacities, and a particular number of hard disk drives (HDDs) in the backplane of the sled. The power capacities of the CPUs may be 275 W, 300 W, or the like. The number of HDDs may be two, four, eight, or the like.

In an example, any BMC 340-354 may request a boot operation for the corresponding sled 340-354, which in turn may initiate one or more operations in EC 330 and all BMCs. For brevity and clarity, operations herein will be described with respect to BMC 340 of sled 310 and EC 330, but may be performed by any BMC within chassis 302. For example, BMC 340 may request a boot operation for sled or server 310. Based on the boot operation request, BMC 340 may collect configuration information for sled 310 from any suitable source. In an example, the source of the configuration information may include, but is not limited to, BMC 340 polling all components within sled 310 to determine characteristics for the components, BMC retrieving system inventory data from any suitable memory, and BMC retrieving data from TCT 360. Based on the configuration information for sled 310, BMC 340 may determine an airflow impedance for the sled based on determined platform airflow characterizations in the system inventory data. For example, during POST, BMC 304 may match the system inventory of components in sled 310 to a characterized impedance level table to determine the relative sled impedance. BMC 340 may provide a power allocation request and the airflow impedance for sled 310 to EC 330. In an example, the power allocation request may include a request to boot sled 310 to an operating system.

Figure 4:
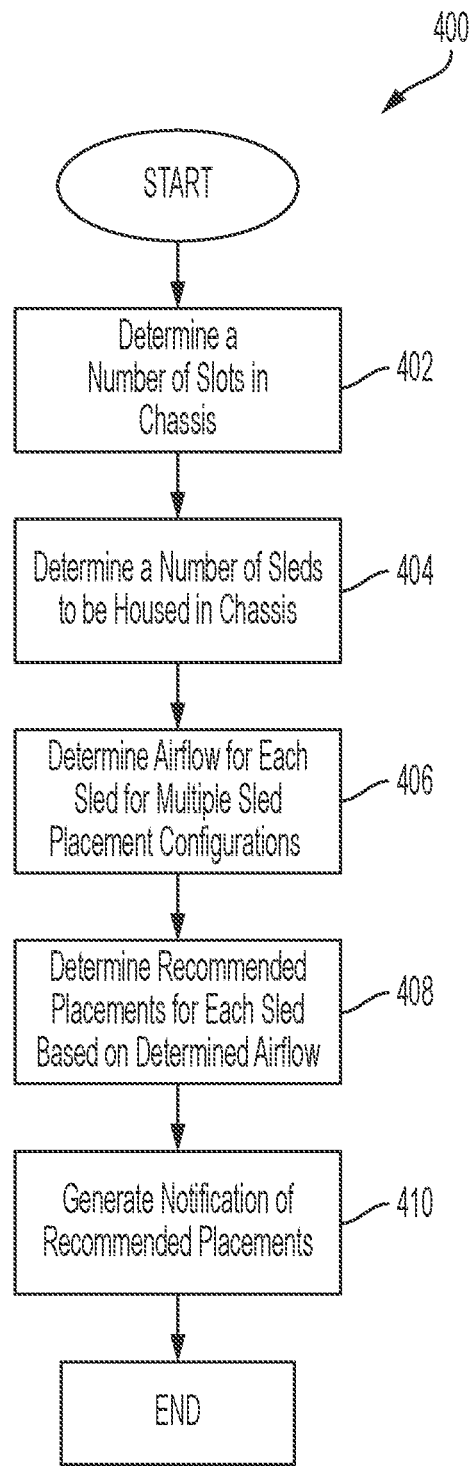
FIG. 4 is a flow chart diagram of an example method for determining recommended placements of sleds within a chassis according to some embodiments of the disclosure.

In response to receiving the power allocation request and the airflow impedance of sled 310, EC 330 may perform one or more suitable operations to determine a maximum airflow for each sled or slot 310-324. EC 330 may communicate with all BMCs 340-354 to retrieve the airflow impedance for respective sleds 310-324. In certain examples, EC 330 may utilize the received airflow impedance in a machine learning system, such as machine learning system 400 of FIG. 4, to determine the maximum airflow available to each sled 310-324.

In some embodiments, the embedded controller 330 of the information handling system 300, or another information handling system, may query the sleds 310-324 to determine one or more properties of the sleds. For example, the embedded controller 330 may determine an identity and/or model of each sled and may determine a relative impedance and/or an airflow threshold, such as a required cubic feed per minute (CFM) for each sled when the sled is generating a maximum amount of heat and/or operating at maximum capacity. For example, the relative impedances may be any suitable value including, but not limited to, 0, 1, 2, 3, and 4 specifying an impedance of the sled relative to other sleds. In this example, a slot with a blank inserted as the sled may have a relative impedance of 4 or any corresponding highest impedance value. In some embodiments, the lowest value for the relative impedances may represent the highest airflow impedance without varying from the scope of the disclosure. The required CFM may, for example, be a required airflow for each sled, determined based on factors such as heat generation of the sled and a predetermined operating temperature range or maximum temperature threshold for each sled. In some embodiments, the embedded controller 330, or another information handling system, may obtain a relative impedance and a required CFM directly from each sled, such by querying each sled for a relative impedance and required CFM stored by each sled.

An information handling system, such as information handling system 200, or another information handling system, may determine recommended placements for each of a plurality of sleds to be housed in a chassis of the information handling system based on determined airflows for each of the plurality of sleds in each of a plurality of placement configurations. An example method 400, shown in FIG. 4, may begin at step 402 with determining a number of slots in a chassis. In some embodiments, a number of slots in a chassis may be predetermined. For example, a number of slots in a chassis of an information handling system may be stored in a memory of the information handling system. Alternatively or additionally, a first information handling system may be queried by a second information handling system to determine a number of slots in a chassis of the first information handling system. For example, a second information handling system may query an embedded controller 330 of an information handling system 300 to determine a number of slots in the chassis 302 of the information handling system. In some embodiments, a number of slots in a chassis of an information handling system may be entered by a user, such as when configuring a chassis buildout in an online store portal or configuration application.

At step 404, a number of sleds to be housed in the chassis may be determined. For example, a number of sleds equal to or less than a number of slots in the chassis may be housed in the chassis. In some embodiments, a number of sleds to be housed in the chassis may be determined by receiving input from a user, such as a user specifying a number of sleds to be included in a chassis, such as via an online store application or a chassis configuration application. In some embodiments, a number of sleds to be housed in the chassis may be obtained by sensing the one or more sleds within the chassis. For example, an embedded controller 330 of the information handling system 300 including the chassis 302 may sense a number of sleds present in slots of the chassis, such as by communicating with or otherwise sensing the sleds present in the chassis.

At step 406, an airflow for each sled to be housed in the chassis may be determined for each of a plurality of placement configurations. For example, an array of potential placement configurations may be determined based on the number of slots in the chassis and the number of sleds to be housed in the chassis. For example, if eight sleds are to be housed in an eight-slot chassis, there may be 40,320 possible placement configurations for the eight sleds within the chassis. Different numbers of slots and sleds may lead to different numbers of potential placement configurations. An airflow, such as a maximum airflow, may be determined for each sled in each of a plurality of placement configurations, such as all potential placement configurations. Thus, if eight sleds are to be housed in an eight-slot chassis, eight airflows, one for each sled, may be determined for each placement configuration, leading to a total of 322,560 determined sled airflows. In some embodiments, when a chassis includes more slots than sleds to be housed in the chassis, airflows may be determined for the sleds only, or for the empty slots of the chassis as well. Airflows, such as maximum airflows, for each of the sleds in each of the plurality of placement configurations, may be determined using the methods described in U.S. patent application Ser. No. 17/242,443, such as by using a machine learning algorithm to determine the airflow for each sled in each configuration. In some embodiments, the airflows for each sled of the plurality of sleds may be determined in the cloud by one or more remote information handling systems. The airflow thresholds may be determined based, at least in part, on a relative impedance for each sled. For example, a relative impedance for each sled may be retrieved from each sled by an embedded controller of the chassis of the information handling system. Alternatively, a relative impedance for each sled may be retrieved from a database of relative impedances based on an identity of each sled, determined by an embedded controller of the chassis or another information handling system.

At step 408, recommended placements for each of the sleds within the chassis may be determined based on the determined airflow for each of the sleds in each of the plurality of placement configurations. For example, one of the plurality of configurations, such as one of all potential placement configurations, may be selected for recommendation based on the determined airflows of the sleds in the plurality of placement configurations. A placement for each of the plurality of sleds may be determined based on the selected placement configuration. In some embodiments, a placement configuration may be selected that minimizes an amount of cooling required, such as an amount of fan operation required, to maintain the sleds within predetermined temperature ranges or below predetermined temperature thresholds.

At step 410, a notification may be generated comprising the recommended placements. For example, an information handling system may display a diagram or print a printout of a diagram showing recommended placements for each of the plurality of sleds within the chassis. For example, if the recommended placements for each of the plurality of sleds were determined in response to a request in an online store portal, such as an order validator or enterprise infrastructure planning tool (EIPT), by a user, such as an administrator, selecting a combination of sleds and a chassis for purchase, a notification of a recommended placement configuration may be displayed for the user via the online store portal. In other embodiments, the recommended placements may be determined in response to a request by a user, such as an administrator, using a graphical user interface (GUI) of the information handling system, and the recommended placements including the chassis and sleds may be displayed on a display of the information handling system via the GUI of the information handling system. For example, the store portal and/or the GUI of the information handling system may display recommended slot numbers and associated sled service tags. Thus, a user may be informed of recommended slot placements for the sleds of a chassis both at point of sale when selecting a combination of sleds and a chassis and at runtime during or after implementing the chassis and sleds onsite. In some embodiments, if no recommended placement for each of the plurality of sleds is available, notification may be generated and/or a user may be prompted to select a different combination of sleds and a chassis.

Generating the notification comprising the recommended placements of the sleds may reduce costs, enhance energy savings, and enhance a user experience. For example, placing sleds in a recommended placement configuration may reduce the amount of cooling and fan operation necessary to keep the sleds within desired temperature parameters. The reduction in cooling needed may reduce energy costs and usage, as well as increasing the lifetime of internal cooling components such as fans. Furthermore, a reduction in cooling required may enhance a user experience by enhancing the acoustics of the chassis and sleds and reducing an amount of noise generated by cooling systems of the information handling system including the chassis and sleds. Determining a placement configuration may also allow manufacturers to sell system configurations that they would not otherwise be able to sell. For example, by determining a recommended placement configuration, manufacturers may sell sled-chassis combinations that, in a worst-case placement configuration, would not provide sufficient cooling to the sleds but, in a recommended placement configuration do provide sufficient airflow and/or cooling to the sleds.

As one example, a user, such as an administrator, may configure an information handling system including six homogenous maximum thermal design power sleds in an eight-slot chassis with two blanks in the slots. Determination of a recommended placement configuration and placement of the sleds according to the recommended placement configuration in ten such chassis may save over $1,475 per year of operation of the system over other placement configurations, such as by placing blanks in slots 220 and 230 of the chassis 202 of FIG. 2A, for example, instead of placing blanks in slots 230 and 232.

As another example, a user may configure an information handling system including eight sleds with a mix of data storage and processing sleds. Placement of the sleds according to a recommended placement configuration in such a configuration may save more than $430 in power costs per year per chassis.

Figure 5:
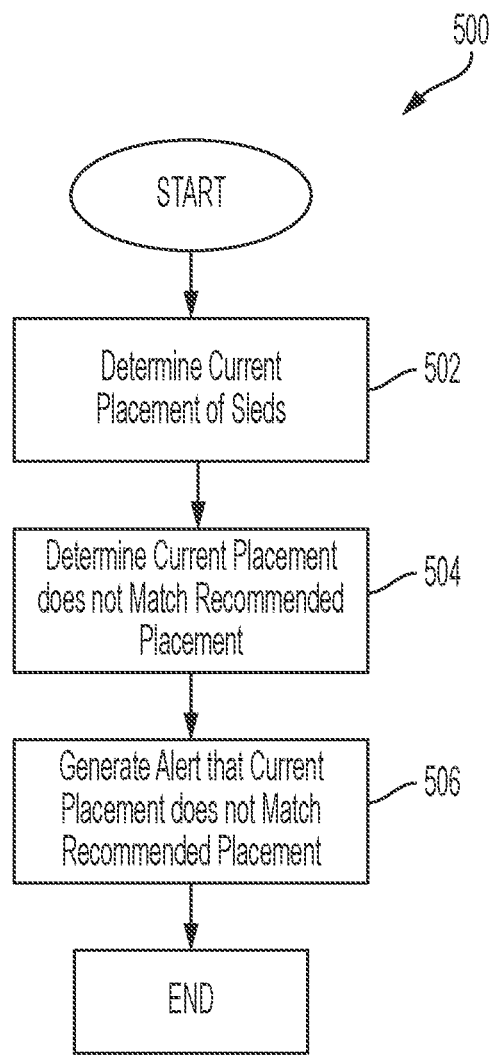
FIG. 5 is a flow chart diagram of an example method for generating an alert when a current placement of one or more sleds within a chassis does not match a recommended placement of the one or more sleds within the chassis according to some embodiments of the disclosure.

In some embodiments, an information handling system may determine a current placements of sleds to determine if a current placement of sleds within a chassis matches a recommended placement of sleds within the chassis. An example method 500 for determining whether a current placement of sleds within a chassis matches a recommended placement of sleds within the chassis is shown in FIG. 5. Like the method 400, the method 500 may be performed by the information handling system including the chassis and the sleds or by an external information handling system. In some embodiments the method 500 may be performed following the method 400, between steps 408 and 410 of the method 400, or at another point during execution of the method 400 of FIG. 4. The method 500 may begin at step 502 with determining a current placement of sleds within the chassis. For example, an information handling system external to the information handling system with the chassis and the sleds may communicate with an embedded controller of the information handling system including the chassis and the sleds to determine a position of each sled within the chassis. Alternatively or additionally, an embedded controller of the information handling system may sense and/or otherwise communicate with the sleds housed in the slots of the chassis to determine a placement of each of the sleds within the chassis.

At step 504, a determination may be made that the current placement of the sleds does not match a recommended placement of the sleds. For example, an information handling system may compare the current placement of each of the sleds with the recommended placements for each sled determined at step 408 of method 400 and may determine that one or more of the current placements of the sleds do not match the recommended placements of the sleds. For example, one or more sleds may be located in slots that differ from the recommended slots for each of the sleds.

At step 506, an alert may be generated, such as an alert for an administrator, that the current placement does not match the recommended placement. Such an alert may be made, for example, as part of step 410 of method 400. In some embodiments, for example, an indicator light may be activated on the chassis or one or more of the sleds indicating that a placement of the sleds differs from a recommended placement. In some embodiments, an audio tone may be emitted. As another example, an alert may be displayed on a display of an information handling system, such as a remote information handling system, or via a GUI of the information handling system under analysis to alert a user that a current placement configuration of the sleds does not match a recommended placement configuration of the sleds. For example, a text, email, or other alert may be transmitted to a mobile device of the user, such as a laptop or smart phone. In some embodiments, the alert generated and/or transmitted to the user may inform the user of cost and energy savings that may be realized by modifying the placement of the sleds to match the recommended placement configuration. For example, an information handling system, such as a remote cloud-based information handling system, may determine an energy usage and cost of the energy usage for both the current placement configuration and the recommended placement configuration, and information detailing the potential cost and energy savings realized upon adjusting placements of the sleds within the chassis to match the recommended placement configuration may be provided to the user as part of the alert. Other information may be included in a notification provided to a user, such as an estimated cost of power for cooling if configured in a placement configuration requiring a greatest amount of power over a year and over a lifecycle of the configuration, an identifier of a best case placement configuration, an identifier of a worst case placement configuration, an identifier of a number of potential placement configurations that comply with cooling requirements of the sleds, a determined airflow for each of the sleds in the recommended and worst case placement configurations, a relative impedance of each of the sleds, a required cooling of each of the sleds, a service tag of each of the sleds, a recommendation of a slot from which a currently placed sled should be moved according to the recommended placement configuration, a recommendation of a slot to which a sled should be moved according to the recommended placement configuration, and other details. In some embodiments, energy cost data may be determined and displayed for multiple regions based on real time energy costs in each of the regions. In some embodiments, an embedded controller of the chassis, or other information handling system, may be configured to determine the airflow for each slot, such as a maximum airflow for each slot, a guaranteed airflow for each slot, or a live airflow for each slot, in real time for a current placement configuration of the sleds within the chassis and/or one or more other placement configurations. The embedded controller of the chassis, or other information handling system, may determine a value of dollars per Watt per region based on the determined airflows for multiple placement configurations, regional power costs, and power required to generate the airflow for comparison of multiple placement configurations, such as comparison of a current placement configuration with a recommended placement configuration. The dollars per Watt per region for the placement configurations may be provided to an user live, such as via display using a GUI of the information handling system including the chassis, for live comparison of multiple different placement configurations. Thus, a current placement configuration of the sleds within the chassis may be monitored, and a user may be notified when the current placement configuration differs from a recommended placement configuration.

Figure 6:
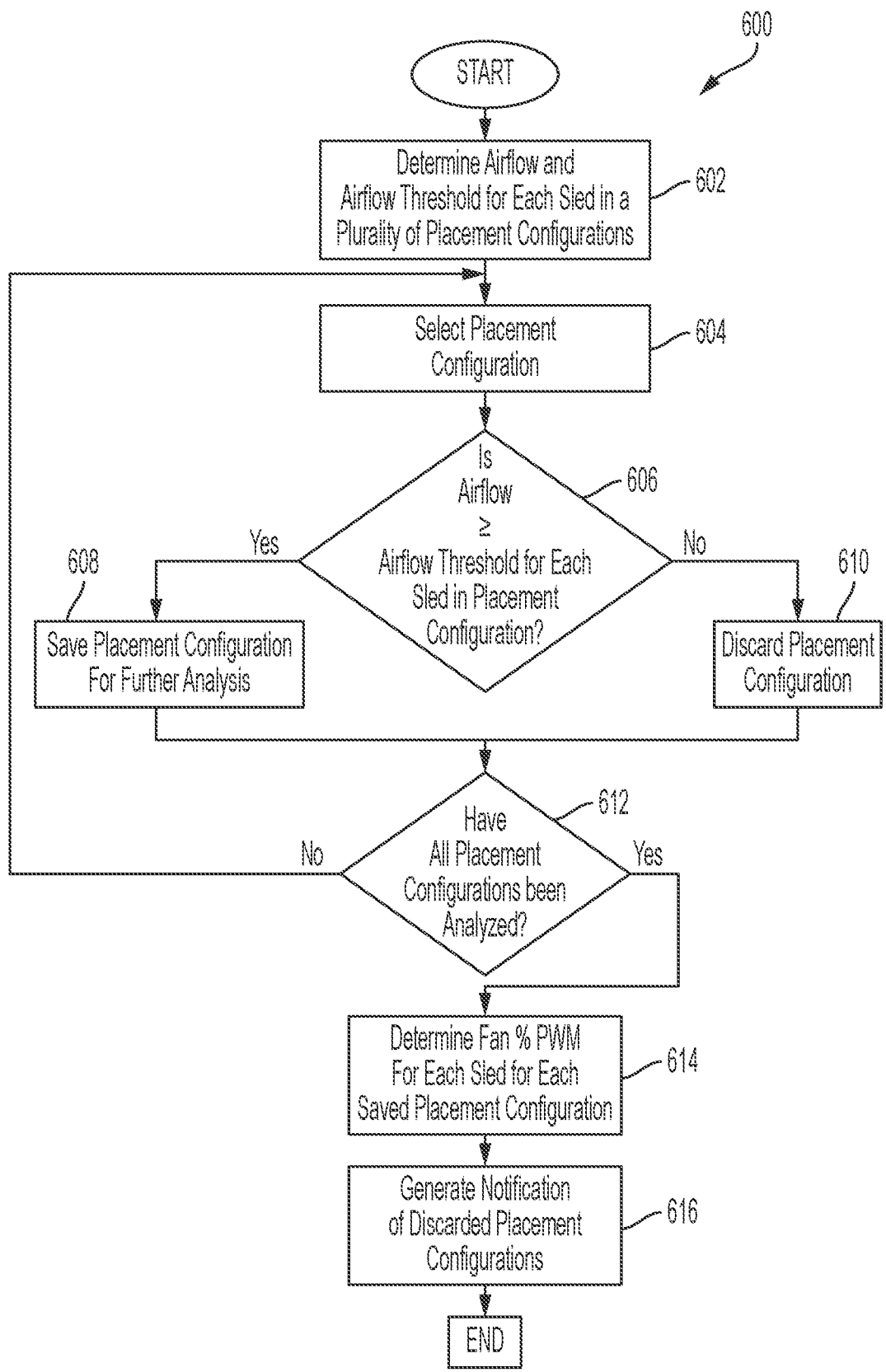
FIG. 6 is a flow chart diagram of an example method for determining whether an airflow of sleds in placement configurations is greater than or equal to an airflow threshold for each of the sleds according to some embodiments of the disclosure.

In some embodiments, placement configurations where a determined airflow, such as a determined maximum CFM, of each of the plurality of sleds is not greater than or equal to an airflow threshold, such as a required CFM for cooling of the sleds, for each of the sleds. A method 600 for discarding placement configurations where determined airflows for one or more of the plurality of sleds are less than airflow thresholds for the one or more of the plurality of sleds is shown in FIG. 6. The method 600 may begin, at step 602, with determining an airflow, such as a calculated airflow, and an airflow threshold for each sled in a plurality of placement configurations. For example, determined airflows may be determined for each sled in the plurality of placement configurations as described with respect to step 406 of FIG. 4. In some embodiments, the plurality of placement configurations for which airflows are determined may be a set of all possible placement configurations determined based on a number of sleds and a number of slots within a chassis. The method 600 may, for example, be performed as part of step 408 of FIG. 4, and determination of the determined airflow for each sled in the plurality of placement configurations may include receiving the determined airflow for each sled from a remote cloud-based information handling system, accessing stored determined airflows for each of the sleds in each of the plurality of placement configurations, such as accessing determined airflows determined at step 406 of method 400, or otherwise determining the determined airflows for each of the sleds in each of the placement configurations. Airflow thresholds, such as required airflows, for each of the sleds may be determined based on properties of the sleds, or may be predetermined and may be accessed by an information handling system. For example, an embedded controller of the chassis, or another information handling system, may communicate with the sleds to obtain an airflow threshold for each of the plurality of sleds. Alternatively or additionally, an embedded controller of the chassis, or another information handling system, may determine an identity of each of the plurality of sleds, such as a sled service tag for each of the plurality of sleds, and may access an airflow threshold for each of the sleds in a database of required sled airflows, such as a cloud-based database. The airflow threshold may, for example, be a predetermined airflow necessary to maintain a sled within desired temperature parameters, such as below a maximum temperature threshold during operation.

At step 604, a first placement configuration of the plurality of placement configurations may be selected. For example, an information handling system may determine an array of all possible placement configurations of sleds within chassis slots based on a number of sleds and a number of slots within the chassis. The information handling system may then cycle through the slots analyzing them to determine if determined airflows for each of the sleds are less than airflow thresholds for each of the sleds.

At step 606, a determination may be made of whether the determined airflow for each sled in the placement configuration is greater than an airflow threshold for each sled in the placement configuration. For example, the information handling system may cycle through each sled in the placement configuration determining whether the determined airflow for the sled is greater than or equal to the airflow threshold for the sled in that placement configuration. In some embodiments a determined airflow for each slot of the chassis, whether or not a sled is present in the slot, may be compared against an airflow threshold for each slot.

If the determined airflow is determined to be greater than or equal to an airflow threshold for each sled in the placement configuration, the placement configuration may, at step 608, be saved for further analysis. For example, the placement configurations for which a determination is made that the determined airflow is greater than or equal to the airflow threshold for each sled in the placement configuration may be considered for selection as a recommended placement configuration at step 408 of FIG. 4. If one or more of the sleds in the placement configuration has a determined airflow that is less than the airflow threshold for the sled, the placement configuration may be discarded at step 610. Such placement configurations may be discarded as the placement configurations may not allow for sufficient cooling to be provided to the sleds, even when the cooling system(s) of the chassis and/or the sleds are running at full capacity.

At step 612, after the placement configuration is either saved or discarded, a determination may be made of whether all placement configurations have been analyzed to determine whether the determined airflow of each sled is greater than or equal to the airflow threshold for each sled. If placement configurations remain that have not been analyzed, the method 600 may proceed to step 604 to select and analyze one of the remaining placement configurations. Thus, steps 604, 608 and 608 or 610 may be repeated for each placement configuration until each of the plurality of placement configurations have been analyzed.

If all placement configurations have been analyzed, the method may, at step 614, determine a slot fan control parameter for each sled for each saved placement configuration. A slot fan control parameter may, for example, include a slot fan % PWM for a sled of a configuration. Alternatively or additionally, a slot fan control parameter may include an average fan speed for one or more fans for cooling the sled, an activation time for one or more fans for cooling the sled, a maximum predicted fan speed for one or more fans for cooling the sled, an average air flow rate required to be produced to cool the sled, or another fan control parameter. A slot fan % PWM may be a percentage of time of slot fan activation required to provide cooling to keep the sled at or below the required CFM based on the determined CFM. Thus, a slot fan control parameter, such as a slot fan % PWM, may be determined for each sled in each of the plurality of placement configurations where the determined airflow for each of the sleds is greater than or equal to an airflow threshold for each of the sleds. The slot fan control parameter for each sled may be determined by dividing the airflow threshold, such as a required CFM under maximum heat generation conditions, for each sled by a product of the determined airflow, such as the determined maximum CFM, for each sled and 100. In some embodiments a slot fan control parameter, such as a slot fan % PWM, may be determined for each slot in each saved placement configuration. In other embodiments a slot fan control parameter may be determined for each sled or slot in all placement configurations of the plurality of placement configurations.

At step 616, a notification may be generated comprising information detailing discarded placement configurations. For example, a number of and/or identity of discarded placement configurations may be included in the notification. If all placement configurations have been discarded, a notification may be generated that no placement configurations that meet the required parameters are available. For example, if a user is assembling a system including a chassis and sleds in an online store portal and no possible placement configuration of the selected sleds within the chassis where the determined airflow of each sled is greater than an airflow threshold of each sled exist, a request may be made that the user select a different chassis and/or combination of sleds. Thus, placement configurations of the plurality of placement configurations may be filtered to discard placement configurations having a determined airflow less than an airflow threshold for one or more of the sleds, and a slot fan control parameter, such as a slot fan % PWM, may be determined for each sled for each placement configuration or each remaining placement configuration after the filtering is performed. All or part of the method 600 may, in some embodiments, be performed by an embedded controller or processor of the chassis of the information handling system including the chassis and sleds being analyzed, such as embedded controller 330 of FIG. 3. In some embodiments, all or part of the method 600 may be performed by a different information handling system, such as a remote cloud-based information handling system.

Figure 7:
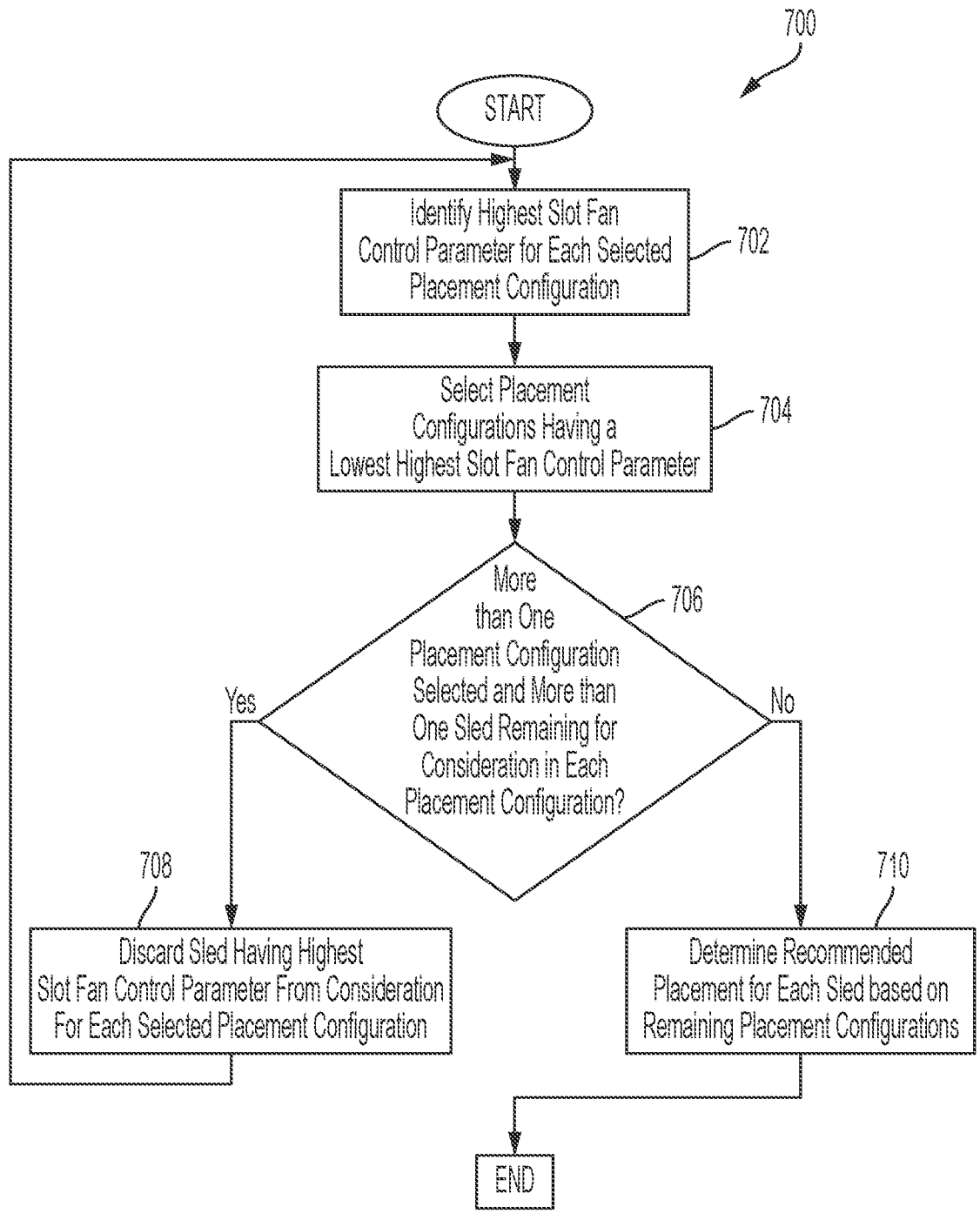
FIG. 7 is a flow chart diagram of an example method for analyzing placement configurations of a plurality of sleds within a chassis based on slot fan control parameters of the sleds in each placement configuration to determine a recommended placement for one or more of the plurality of sleds according to some embodiments of the disclosure.

Potential placement configurations may be further filtered based on determined slot fan control parameters for the sleds within the placement configurations to select a recommended placement configuration that minimizes required cooling, such as fan activation, to maintain sleds within predetermined operational parameters, such as at or above an airflow threshold for the sleds. An example method 700 for selecting a recommended placement configuration based on determined slot fan control parameters for each of the sleds within the placement configurations is shown in FIG. 7. The method 700 may, for example, be performed as part of step 408 of method 400. In some embodiments, the method 700 may be performed subsequent to the method 600 of FIG. 6. In other embodiments, steps 602-612 and 616 of FIG. 6 may be skipped and the method 700 may be performed following step 614 of FIG. 6 on all potential placement configurations of sleds within slots of a chassis. All or part of the method 700 may, in some embodiments, be performed by an embedded controller or processor of the chassis of the information handling system including the chassis and sleds being analyzed, such as embedded controller 330 of FIG. 3. In some embodiments, all or part of the method 700 may be performed by a different information handling system, such as a remote cloud-based information handling system.

The method 700 may begin at step 702 with identification of a highest slot fan control parameter, such as a highest slot fan % PWM, of each placement configuration. For example, an information handling system may analyze each sled or slot of each placement configuration of the plurality of placement configurations, or each remaining placement configuration after method 600 has been performed, to identify a highest slot fan control parameter for each placement configuration. In some embodiments, all placement configurations, or all placement configurations where all sleds have a determined airflow greater than or equal to an airflow threshold, may be initially selected in the first iteration of step 702.

At step 704, placement configurations having a lowest highest slot fan control parameter, such as a lowest highest slot fan % PWM, may be selected. For example, an information handling system may analyze each placement configuration to determine a slot fan control parameter for each placement configuration that is the highest. One or more placement configurations having a lowest slot fan control parameter, such as a lowest slot fan % PWM, for the slot of the placement configuration having the highest slot fan control parameter may be selected. In some embodiments, a sled may have different slot fan control parameters in different placement configurations, and thus a sled that has a highest slot fan control parameter may differ between placement configurations. Thus, a sled to which the slot fan control parameter applies may also be determined. If multiple placement configurations have the same highest slot fan control parameter that is lower than a highest slot fan control parameter of the remaining placement configurations, multiple placement configurations may be selected. In some embodiments, a range may be used in selecting placement configurations having a lowest highest slot fan control parameter. For example, a lowest highest slot fan control parameter of all the placement configurations may be selected and all placement configurations having lowest highest slot fan control parameters within a predetermined threshold distance, such as 1% or 5% or another threshold distance, of the lowest highest slot fan control parameter of the placement configurations may be selected.

At step 706, a determination may be made of whether more than one placement configuration has been selected and whether more than one sled is remaining for consideration in each placement configuration. If more than one placement configuration has been selected at step 704 and more than one sled is remaining for analysis in each selected placement configuration, the method may proceed to, at step 708, discard a sled having the highest slot fan control parameter from consideration for each selected placement configuration. As an example, placement configurations of FIGS. 2A and 2B may be selected as having a lowest highest slot fan control parameter, at step 704. If sled 210 if FIG. 2A was determined to have a highest slot fan control parameter in the placement configuration FIG. 2A, sled 210 may, at step 706, be discarded from consideration with respect to the placement configuration of FIG. 2A in further analysis. If sled 212 of FIG. 2B was determined to have a highest slot fan control parameter of FIG. 2B of the placement configuration of FIG. 2B, sled 212 may, at step 706, be discarded from consideration with respect to the placement configuration of FIG. 2B in future analysis.

After discarding the sled having the highest slot fan control parameter from consideration for each selected placement configuration, the method 700 may return to step 702, where the highest slot fan control parameter for each selected placement configuration may be identified among the remaining sleds of the placement configurations selected in the earlier iteration of step 704. Thus, for example, as the sleds having the highest slot fan control parameter from each placement configuration selected at step 704 were discarded from consideration at step 708, the sleds having the second highest fan control parameter of the placement configurations selected at step 704 may be determined in the second iteration of step 702. For example, if the placement configurations of FIG. 2A and FIG. 2B were selected at the earlier iteration of step 704, and sled 210 of FIG. 2A and sled 212 of FIG. 2B were determined to have the highest slot fan control parameters of the placement configurations of FIGS. 2A-B and thus discarded, the slot fan control parameters of sleds 212, 214, and 216 of FIG. 2A may be analyzed to determine the highest slot fan control parameter of the remaining sleds of the placement configuration of FIG. 2A, and sleds 210, 214, and 216 of the placement configuration of FIG. 2B, respectively. The method may then proceed, at step 704, to select one or more of the selected placement configurations selected in the previous iteration of step 704 having a lowest highest slot fan control parameter of the remaining sleds.

Thus, the method 700 may cycle through steps 702, 704, 706, and 708 until either a single placement configuration is selected, or no more than a single sled remains undiscarded in each selected placement configuration. Thus, for example, steps 702, 704, and 706, may be repeated a maximum of eight times in a configuration having eight different sleds. As steps 702-708 are repeated, the number of selected placement configurations and/or the number of sleds remaining for analysis may be reduced with each iteration. In some cases, steps 702, 704, and 706 may go through 7, 3, or another number of iterations before a single placement configuration is selected or no more than a single sled is remaining in each selected placement configuration. If a determination is made at step 706 that either only a single placement configuration was selected at the most recent iteration of step 704 or that no more than one sled is remaining for consideration in each selected placement configuration, the method may proceed, at step 710, to determine recommended placements for each of the sleds within the chassis based on the remaining placement configuration(s). For example, if a single placement configuration was selected at the most recent iteration of step 704, a placement for each of the sleds may be determined based on the single selected placement configuration. If multiple placement configurations were selected based on the most recent iteration of step 704, placements for each of the sleds within the slots of the chassis may be determined based on one of the selected placement configurations, such as a first of the selected placement configurations. Thus, a placement for a plurality of sleds in a chassis may be determined that minimizes a slot fan control parameter, such as a slot fan % PWM, for one or more of the sleds within the chassis using based, at least in part, on a determined airflow for the sleds of the chassis.

The flow chart diagrams of FIGS. 4-7 are generally set forth as logical flow chart diagrams. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for determining positioning for a plurality of sleds in an information handling system chassis, comprising:
   determining a number of slots in the chassis;
   determining a number of the plurality of sleds to be housed in the chassis;
   determining an airflow for each of the plurality of sleds for a plurality of placement configurations based, at least in part, on the number of slots and the number of the plurality of sleds;
   determining, based at least in part on the airflow for each of the plurality of sleds for the plurality of placement configurations, a recommended placement for each of the plurality of sleds;
   wherein determining the recommended placement for each of the plurality of sleds comprises:
      determining one or more first recommended placement configurations from the plurality of placement configurations that have a lowest highest slot fan control parameter of the plurality of sleds; and
      determining a recommended placement for each of the plurality of sleds based, at least in part, on the determination of the one or more first recommended placement configurations; and
   generating a notification comprising the recommended placements for each of the plurality of sleds.

2. The method of claim 1, further comprising:
   determining a current placement of each of the plurality of sleds within the chassis; and
   determining that one or more of the current placements of each of the plurality of sleds within the chassis do not match one or more of the recommended placements for each of the plurality of sleds,
   wherein generating a notification comprising the recommended placements comprises generating an alert that one or more of the current placements of each of the plurality of sleds do not match one or more of the recommended placements for each of the plurality of sleds.

3. The method of claim 1, wherein determining a recommended placement for each of the plurality of sleds further comprises:
   determining one or more second recommended placement configurations from among the one or more first recommended placement configurations that further have a lowest second highest slot fan control parameter of the plurality of sleds; and
   determining a recommended placement for each of the plurality of sleds based, at least in part, on the determination of the one or more second recommended placement configurations.

4. The method of claim 1, wherein determining a recommended placement for each of the plurality of sleds further comprises:
   determining an airflow threshold for each of the plurality of sleds; and
   determining a slot fan control parameter for each sled for one or more of the plurality of placement configurations based, at least in part, on the airflow threshold determined for each of the plurality of sleds wherein the slot fan control parameter determined for each sled for the one or more of the plurality of placement configurations comprises a slot fan pulse width modulation percentage (% PWM),
   wherein determining one or more first recommended placement configurations from the plurality of placement configurations that have a lowest highest slot fan control parameter of the plurality of sleds is based, at least in part, on the determined slot fan % PWM for each sled for one or more of the plurality of placement configurations.

5. The method of claim 4, wherein determining a slot fan control parameter for each sled for one or more of the plurality of placement configurations based, at least in part, on the airflow threshold determined for each of the plurality of sleds comprises dividing the airflow threshold for each sled by a multiple of the determined airflow for each sled for each of the one or more of the plurality of placement configurations.

6. The method of claim 4, further comprising:
   determining, for each placement configuration of the one or more of the plurality of placement configurations, that the determined airflow for each of the plurality of sleds is greater than or equal to the airflow threshold for each respective sled of the plurality of sleds.

7. The method of claim 1, wherein the method is performed by an embedded controller of the information handling system.

8. An information handling system, comprising:
a processor; and
a memory,
wherein the processor is configured to perform steps comprising:
determining a number of slots in a chassis;
determining a number of a plurality of sleds to be housed in the chassis;
calculating an airflow for each of the plurality of sleds for a plurality of placement configurations based, at least in part, on the number of slots and the number of the plurality of sleds;
determining, based at least in part on the airflow for each of the plurality of sleds for the plurality of placement configurations, a recommended placement for each of the plurality of sleds;
wherein determining the recommended placement for each of the plurality of sleds comprises:
determining one or more first recommended placement configurations from the plurality of placement configurations that have a lowest highest slot fan control parameter of the plurality of sleds; and
determining a recommended placement for each of the plurality of sleds based, at least in part, on the determination of the one or more first recommended placement configurations; and
generating a notification comprising the recommended placements for each of the plurality of sleds.

9. The information handling system of claim 8, wherein the processor is further configured to perform steps comprising:
determining a current placement of each of the plurality of sleds within the chassis; and
determining that one or more of the current placements of each of the plurality of sleds within the chassis do not match one or more of the recommended placements for each of the plurality of sleds,
wherein generating a notification comprising the recommended placements comprises generating an alert that one or more of the current placements of each of the plurality of sleds do not match one or more of the recommended placements for each of the plurality of sleds.

10. The information handling system of claim 8, wherein determining a recommended placement for each of the plurality of sleds further comprises:
determining one or more second recommended placement configurations from among the one or more first recommended placement configurations that further have a lowest second highest slot fan control parameter of the plurality of sleds; and
determining a recommended placement for each of the plurality of sleds based, at least in part, on the determination of the one or more second recommended placement configurations.

11. The information handling system of claim 8, wherein determining a recommended placement for each of the plurality of sleds further comprises:
determining an airflow threshold for each of the plurality of sleds; and
determining a slot fan control for each sled for one or more of the plurality of placement configurations based, at least in part, on the airflow threshold determined for each of the plurality of sleds, wherein the slot fan control parameter determined for each sled for the one or more of the plurality of placement configurations comprises a slot fan pulse width modulation percentage (% PWM),
wherein determining one or more first recommended placement configurations from the plurality of placement configurations that have a lowest highest slot fan control parameter of the plurality of sleds is based, at least in part, on the determined slot fan % PWM for each sled for one or more of the plurality of placement configurations.

12. The information handling system of claim 11, wherein determining a slot fan control parameter for each sled for one or more of the plurality of placement configurations based, at least in part, on the airflow threshold determined for each of the plurality of sleds comprises dividing the airflow threshold for each sled by a multiple of the determined airflow for each sled for each of the one or more of the plurality of placement configurations.

13. The information handling system of claim 11, further comprising:
determining, for each placement configuration of the one or more of the plurality of placement configurations, that the determined airflow for each of the plurality of sleds is greater than or equal to the airflow threshold for each respective sled of the plurality of sleds.

14. A computer program product, comprising:
a non-transitory computer readable medium, wherein the non-transitory computer readable medium comprises instructions for causing a processor to perform steps comprising:
determining a number of slots in a chassis of an information handling system;
determining a number of a plurality of sleds to be housed in the chassis;
calculating an airflow for each of the plurality of sleds for a plurality of placement configurations based, at least in part, on the number of slots and the number of the plurality of sleds;
determining, based at least in part on the airflow for each of the plurality of sleds for the plurality of placement configurations, a recommended placement for each of the plurality of sleds;
wherein determining the recommended placement for each of the plurality of sleds comprises:
determining one or more first recommended placement configurations from the plurality of placement configurations that have a lowest highest slot fan control parameter of the plurality of sleds; and
determining a recommended placement for each of the plurality of sleds based, at least in part, on the determination of the one or more first recommended placement configurations; and
generating a notification comprising the recommended placements for each of the plurality of sleds.

15. The computer program product of claim 14, wherein the non-transitory computer readable medium further includes instructions to cause a processor to perform steps comprising:
determining a current placement of each of the plurality of sleds within the chassis; and
determining that one or more of the current placements of each of the plurality of sleds within the chassis do not match one or more of the recommended placements for each of the plurality of sleds,
wherein generating a notification comprising the recommended placements comprises generating an alert that one or more of the current placements of each of the plurality of sleds do not match one or more of the recommended placements for each of the plurality of sleds.

16. The computer program product of claim 14, wherein determining a recommended placement for each of the plurality of sleds further comprises:
   determining one or more second recommended placement configurations from among the one or more first recommended placement configurations that further have a lowest second highest slot fan control parameter of the plurality of sleds; and
   determining a recommended placement for each of the plurality of sleds based, at least in part, on the determination of the one or more second recommended placement configurations.

17. The computer program product of claim 14, wherein determining a recommended placement for each of the plurality of sleds further comprises:
   determining an airflow threshold for each of the plurality of sleds;
   determining a slot fan control parameter for each sled for one or more of the plurality of placement configurations based, at least in part, on the airflow threshold determined for each of the plurality of sleds, wherein the slot fan control parameter determined for each sled for the one or more of the plurality of placement configurations comprises a slot fan pulse width modulation percentage (% PWM), and
   wherein determining one or more first recommended placement configurations from the plurality of placement configurations that have a lowest highest slot fan control parameter of the plurality of sleds is based, at least in part, on the determined slot fan % PWM for each sled for one or more of the plurality of placement configurations.

* * * * *